(12) United States Patent
Wang et al.

(10) Patent No.: US 8,788,229 B2
(45) Date of Patent: Jul. 22, 2014

(54) DIGITAL OSCILLOSCOPE AND METHOD FOR CONTROLLING THE SAME

(75) Inventors: Yue Wang, Beijing (CN); Tiejun Wang, Beijing (CN); Weisen Li, Beijing (CN)

(73) Assignee: Rigol Technologies, Inc., Beijing (CN)

( * ) Notice: Subject to any disclaimer, the term of this patent is extended or adjusted under 35 U.S.C. 154(b) by 318 days.

(21) Appl. No.: 13/143,239

(22) PCT Filed: Sep. 26, 2010

(86) PCT No.: PCT/CN2010/077330
§ 371 (c)(1),
(2), (4) Date: Jul. 5, 2011

(87) PCT Pub. No.: WO2011/057522
PCT Pub. Date: May 19, 2011

(65) Prior Publication Data
US 2011/0270560 A1    Nov. 3, 2011

(30) Foreign Application Priority Data

Nov. 10, 2009   (CN) .......................... 2009 1 0237374

(51) Int. Cl.
*G01R 13/02*    (2006.01)
*G01R 13/00*    (2006.01)
*G09G 5/22*     (2006.01)

(52) U.S. Cl.
USPC .............................. 702/67; 702/66; 345/440.1

(58) Field of Classification Search
USPC ..................................... 702/67, 66; 345/440.1
See application file for complete search history.

(56) References Cited

U.S. PATENT DOCUMENTS 4,791,337 A    12/1988 Murata
4,890,237 A  * 12/1989 Bales et al. ..................... 702/76

(Continued)

FOREIGN PATENT DOCUMENTS

CN    1237712 A    12/1999
CN    1712972 A    12/2005
GB    1 465 411     2/1977

OTHER PUBLICATIONS

International Search Report dated Dec. 23, 2010, issued in PCT/CN2010/077330.

(Continued)

*Primary Examiner* — Michael Nghiem
*Assistant Examiner* — Yoshihisa Ishizuka
(74) *Attorney, Agent, or Firm* — Scully, Scott, Murphy & Presser PC

(57) ABSTRACT

Provided are a digital oscilloscope and a method for controlling the same. The digital oscilloscope comprises a trace intensity synthesizer including a first intensity memory and a second intensity memory. The controlling procedure performed by the digital oscilloscope includes: a determining step for determining whether the time interval of a trigger signal is larger than a predetermined threshold, a first fluorescence processing step performed when the time interval of a trigger signal is equal to or less than the predetermined threshold, and a second fluorescence processing step performed when the time interval of a trigger signal is larger than the predetermined threshold. The digital oscilloscope can automatically select the dynamic fluorescence effect to pay attention to the long-term variation of a signal when the triggering rate is low, and the static fluorescence effect to pay attention to the rapid variation of a signal when the triggering rate is high.

12 Claims, 4 Drawing Sheets

(56) References Cited

U.S. PATENT DOCUMENTS

| | | | |
|---|---|---|---|
| 4,940,931 A | 7/1990 | Katayama | |
| 5,412,579 A * | 5/1995 | Meadows et al. | 702/67 |
| 6,163,758 A | 12/2000 | Sullivan et al. | |
| 6,188,384 B1 | 2/2001 | Sullivan et al. | |
| 6,219,029 B1 | 4/2001 | Flakne et al. | |
| 6,222,521 B1 | 4/2001 | Ivers et al. | |
| 6,333,732 B1 | 12/2001 | Gerlach et al. | |
| 6,344,844 B1 * | 2/2002 | Timm et al. | 345/440.1 |
| 6,816,102 B2 * | 11/2004 | Pavicic | 341/155 |
| 2006/0055698 A1 * | 3/2006 | Ritter | 345/440.1 |
| 2007/0217694 A1 * | 9/2007 | Sullivan et al. | 382/232 |

OTHER PUBLICATIONS

Chinese Office Action dated Nov. 1, 2013 received in related case CN 2009-10237374.4.

International Preliminary Report on Patentability together with the Written Opinion dated May 24, 2012.

* cited by examiner with the accumulated intensity information so as to generate new accumulated intensity information corresponding to the dynamic fluorescence effect.

DIGITAL OSCILLOSCOPE AND METHOD FOR CONTROLLING THE SAME

FIELD OF THE INVENTION

The present invention relates to a technique of a digital oscilloscope, and in particular a digital oscilloscope and method for controlling the same.

DESCRIPTION OF RELATED ART

The display system of a traditional analog oscilloscope adopts a Cathode Ray Tube (CRT). CRT has an excellent fluorescence effect (i.e. the activation effect of the fluorescent powder), which makes the trace of the displayed waveform become dark from bright with the lapse of time, such that the characterizations of the waveform are represented in two aspects: one is the variation of the trace itself, and another is the frequency of reoccurrence of the trace.

At present, the display system of the digital oscilloscope mainly adopts a Liquid Crystal Display (LCD) screen which likes a pixel array arranged in two dimensions, and each pixel position in the pixel array can be determined uniquely by a row address and a column address. Each pixel on the LCD display screen can be immediately turned "ON" or "OFF" by controlling the state "ON" or "OFF" of the respective pixel. Although the LCD display screen per se does not possess the fluorescence effect of CRT, the brightness of each pixel on the LCD display screen can be controlled, for example, it can be controlled that said brightness has 15 levels and one "OFF" state when a memory having 4-bit depth is used, and each pixel may have more refined brightness levels when a memory having more bits is used.

With the method for controlling the brightness level of each pixel on the LCD display screen, not only the brightness and color of the pixel on the LCD display screen can be controlled, but also the fluorescence effect can be simulated, such as the static fluorescence effect and the dynamic fluorescence effect commonly used at present.

The principle for achieving the static fluorescence effect is setting a weighted value for the sampled waveform trace according to the times that a signal having the same amplitude value occurs within a time window after a trigger or according to the variation of the trace itself such that the weighted value reflects the frequency of reoccurrence of the trace with in a time window (for example, when a weighted statistically calculation is performed to the times that the same amplitude value occurs within a time window after a trigger, the more it occurs the higher the weighted value is, and the less it occurs, the smaller the weighted value is) and/or the variation of the trace itself (for example, the weighted value is small when the trace varies quickly between two sample points, and the weighted value is large when the trace varies slowly between two sample points). The weighted value of the trace is commonly referred to as an intensity value or an intensity information of the trace. The LCD display screen can represent the static fluorescence effect when the intensity information of the trace is applied to the LCD display screen.

In the case where the LCD display screen represents the static fluorescence effect, when a time window comes, it is necessary to remove the intensity information held for the last time window in order to avoid the signal intensity to be increased infinitely, and to newly apply the intensity information of a new trace to the LCD display screen according to the above-mentioned principle. Since the static fluorescence effect is actually a display effect having a fixed intensity, that is, the common display effect in the probability mode, and since no system time is needed to handle the association information between the time windows so as to achieve the static fluorescence effect, the digital oscilloscope adopting the static fluorescence effect may have high Waveform Capture Rate. Whereas a user can hardly distinguish the sequencing of the waveform traces since there is no relationship between the intensity information of the time windows under the static fluorescence effect.

Another simulated fluorescence effect is a dynamic fluorescence effect, the principle of which is similar to the activation curve of the fluorescent powder, wherein the intensity of the newly coming trace is the largest (most active), the intensity of the trace decreases with the lapse of time, and at last the intensity becomes zero, that is, the intensity of the trace occurred latest is the largest, earlier the trace occurs the smaller intensity it has or even disappears. Therefore the dynamic fluorescence effect is capable of reflecting the frequency of reoccurrence of the traces and the sequencing of the traces under an entire time scale. However, since the dynamic fluorescence effect is a display effect in a variable intensity mode, that is, the common real-time display manner, the digital oscilloscope has to occupy a lot of system resources to continuously attenuate the residual trace information, and a new waveform trace may be imposed only after the attenuation process on the residual trace information is completed, therefore for the digital oscilloscope having the dynamic fluorescence effect, more system resources are consumed and waveform capture rate is lower, such that some transient waveform traces can not be captured and observed.

In the prior art, a user can set a digital oscilloscope manually so that the digital oscilloscope adopts the static fluorescence effect or the dynamic fluorescence effect as required. Although the method in which the user sets the display effect of the digital oscilloscope manually is simple, it brings about a problem of continuously adjusting the display manner of the digital oscilloscope to the user of the digital oscilloscope in the case that the detected signal is inconstant.

SUMMARY OF THE INVENTION

One objective of the present invention is to provide a method for controlling a digital oscilloscope to overcome the problem of not capable of setting the static fluorescence effect and the dynamic fluorescence effect of the digital oscilloscope automatically in the art.

In the method for controlling the digital oscilloscope according to the present invention, said digital oscilloscope comprises a trace intensity calculator for generating intensity information of a waveform trace, a trace intensity synthesizer for generating accumulated intensity information according to the intensity information of the waveform trace generated by said trace intensity calculator, and a displaying means for displaying a waveform according to said accumulated intensity information; and said method includes the steps of: a determining step for determining whether the time interval of a trigger signal is larger than a predetermined threshold, turning to a static fluorescence processing step when said time interval of said trigger signal is equal to or less than the predetermined threshold, and otherwise turning to a dynamic fluorescence processing step; the static fluorescence processing step for accumulating the intensity information of a plurality of waveform traces generated by said trace intensity calculator to generate the accumulated intensity information corresponding to the static fluorescence effect; and the dynamic fluorescence processing step for attenuating old accumulated intensity information and accumulating the intensity information of the waveform trace newly generated by said trace intensity calculator on the basis of the attenuated accumulated intensity information to generate new accumulated intensity information corresponding to the dynamic fluorescence effect.

In the method for controlling the digital oscilloscope according to the present invention, said static fluorescence processing step may further include: while the accumulated intensity information being outputted to said displaying means, accumulating the intensity information of the plurality of waveform traces outputted from said trace intensity calculator to form new accumulated intensity information.

In the method for controlling the digital oscilloscope according to the present invention, said dynamic fluorescence processing step may further include: attenuating the old accumulated intensity information and then accumulating the attenuated accumulated intensity information and the intensity information of a waveform trace newly generated by said trace intensity calculator to generate new accumulated intensity information to output the result information to said displaying means; while the result information being outputted to said displaying means, further attenuating the result information and accumulating the attenuated information and the intensity information of the waveform trace newly generated by said trace intensity calculator to form new accumulated intensity information.

In the method for controlling the digital oscilloscope according to the present invention, said dynamic fluorescence processing step may further include setting the degree of said attenuation according to the length of the time interval of said trigger signal.

In the method for controlling the digital oscilloscope according to the present invention, said dynamic fluorescence processing step may further include said trace intensity calculator setting the outputted intensity information of all trace points on the waveform trace to the maximum value of the intensity information.

In the method for controlling the digital oscilloscope according to the present invention, said predetermined threshold may be set as less than the screen refresh time interval of said displaying means and larger than 70% of the screen refresh time interval.

According to another aspect of the present invention, a digital oscilloscope is provided in order to overcome the problem of not capable of setting the static fluorescence effect and the dynamic fluorescence effect of the digital oscilloscope automatically in the art.

Said digital oscilloscope according to the present invention comprises: a trace intensity calculator for generating intensity information of a waveform trace; a trace intensity synthesizer for generating accumulated intensity information according to the intensity information of a plurality of waveform traces generated by said trace intensity calculator; a displaying means for displaying a waveform according to said accumulated intensity information; and a controller for determining whether the time interval of a trigger signal is larger than a predetermined threshold, making said trace intensity synthesizer accumulate the intensity information of a plurality of waveform traces generated by said trace intensity calculator to generate the accumulated intensity information corresponding to the static fluorescence effect when said time interval of said trigger signal is equal to or less than the predetermined threshold, and making said trace intensity synthesizer attenuate old accumulated intensity information and accumulate the intensity information of the waveform trace newly generated by said trace intensity calculator on the basis of the attenuated accumulated intensity information to generate new accumulated intensity information corresponding to the dynamic fluorescence effect when said time interval of said trigger signal is larger than the predetermined threshold.

In said digital oscilloscope according to the present invention, said trace intensity synthesizer may further include: an accumulating apparatus, a first memory, and a second memory. When said time interval of said trigger signal is equal to or less than the predetermined threshold, said controller performs a first operation and a second operation alternatively. Said first operation includes: the accumulated intensity information held by said second memory is outputted to said displaying means, meanwhile the accumulating apparatus receives and accumulates the intensity information of a plurality of waveform traces outputted from said trace intensity calculator to generate new accumulated intensity information, and said first memory holds the new accumulated intensity information. Said second operation includes: the accumulated intensity information held by said first memory is outputted to said displaying means, meanwhile the accumulating apparatus receives and accumulates the intensity information of a plurality of waveform traces outputted from said trace intensity calculator to generate new accumulated intensity information, and said second memory holds the new accumulated intensity information.

In said digital oscilloscope according to the present invention, said trace intensity synthesizer may further include an attenuator. When said time interval of said trigger signal is larger than the predetermined threshold, said controller performs a third operation and a fourth operation successively. Said third operation includes: said attenuator attenuates the old accumulated intensity information held by said first memory once, and said accumulating apparatus accumulates the attenuated accumulated intensity information and the intensity information of a waveform trace newly outputted from said trace intensity calculator to generate new accumulated intensity information, and both said first memory and said second memory hold the new accumulated intensity information. Said fourth operation includes: the accumulated intensity information held by said second memory is outputted to said displaying means, meanwhile said attenuator attenuates the accumulated intensity information held by said first memory, and said accumulating apparatus accumulates the attenuated accumulated intensity information and the intensity information of a waveform trace newly outputted from said trace intensity calculator, and said first memory holds the accumulated result.

In said digital oscilloscope according to the present invention, said controller may further set the degree of said attenuation according to the length of the time interval of said trigger signal.

In said digital oscilloscope according to the present invention, said controller may be further used to make said trace intensity calculator set the outputted intensity information of all trace points on the waveform trace to the maximum value of the intensity information when the time interval of said trigger signal is larger than the predetermined threshold.

In said digital oscilloscope according to the present invention, said predetermined threshold may be set as less than the screen refresh time interval of said displaying means and larger than 70% of the screen refresh time interval.

The digital oscilloscope and the method for controlling the digital oscilloscope according to the present invention can adapt to the detected signal automatically and adopt different display method. In particular, the dynamic fluorescence effect is selected automatically for the case where it is necessary to pay attention to the long-term variation of a signal such that the trace intensity information reflects the time characterization of the trace itself and the sequencing between traces. On other hand, the static fluorescence effect is selected automatically for the case where it is necessary to pay attention to the rapid variation of a signal such that the digital oscilloscope has a higher trace capture rate and use the trace intensity information to reflect the frequency of the occurrence of the trace and the variation of the trace itself.

DETAILED DESCRIPTION OF THE INVENTION

Figure 1:
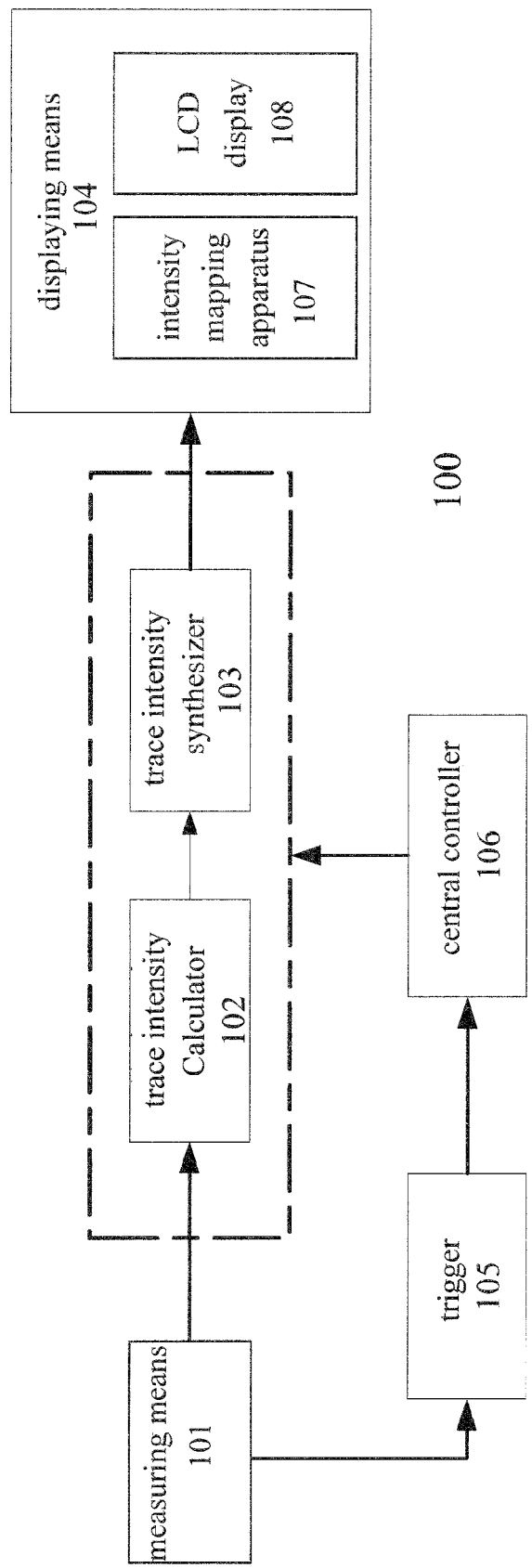
FIG. 1 is a schematic structure diagram of a digital oscilloscope 100 according to an exemplary embodiment of the present invention.

The digital oscilloscope and the method for controlling the same according to the exemplary embodiments of the present invention will be described below in more detail with reference to the drawing.

FIG. 1 is a schematic structure diagram of the digital oscilloscope 100 according to an exemplary embodiment of the present invention.

With reference to FIG. 1, the digital oscilloscope 100 includes a measuring means 101, a trace intensity calculator 102, a trace intensity synthesizer 103, a displaying means 104, a trigger 105, and a central controller 106.

The measuring means 101 receives the detected signal, rectifies the detected signal, and digitally samples the detected signal. The measuring means 101 obtains and outputs a digitally sampled signal while outputting the rectified detected signal to the trigger 105.

The trigger 105 generates a trigger signal according to the rectified detected signal generated by the measuring means 101 or the digitally sampled signal outputted by the measuring means 101. The trigger 105 may have a plurality of triggering types, such as an edge triggering type (rising edge, falling edge, rising edge and falling edge), a pulse width triggering type (larger than, less than or equal to a predefined pulse width), a slope triggering type (larger than or less than the set rising or falling time), set-time type (setting the rising/falling time or time window), and the like. When the detected signal received by the measuring means 101 or the digitally sampled signal outputted by the measuring means 101 meets the triggering condition, the trigger 105 may generate a trigger signal and output the same to the central controller 106. The central controller 106 controls the trace intensity calculator 102 to collect said digitally sampled signal from the measuring means 101 according to the trigger signal outputted by the trigger 105.

It should be noted that the digital oscilloscope 100 can further receive a trigger signal from another means external to or internal of the digital oscilloscope 100, and the central controller 106 can further control the trace intensity calculator 102 to collect said digitally sampled signal from the measuring means 101 according to such a trigger signal.

In the present embodiment, the trace intensity calculator 102 receives the digitally sampled signal from the measuring means 101 and calculates the intensity information of the waveform trace according to said digitally sampled signal.

In particular, the trace intensity calculator 102 performs the following operations after receiving the sampling information about the detected signal:

1. In the digitally sampled information from the measuring means 101, the intensity of the latter sample point in every two sample points is set according to the difference between the amplitude of the two neighboring sample points, that is, according to the absolute value of the difference between the amplitude value of the two neighboring sample points, so as to obtain a group of intensity value reflecting the variation of the amplitude value of all sample points in said digitally sampled signal. During the calculation of the intensity value of the variation of the amplitude value, a small intensity value can be set for a sample point with a large amplitude variation, and otherwise a large intensity value can be set. The particular value of the intensity can be calculated according to a function or obtained by looking up a table.

2. According to the number of the pixels of a LCD display 108 in the displaying means 104, the time base displayed by the digital oscilloscope 100 and the sampling rate of the measuring means 101, the above mentioned intensity value for respective sample points in the digitally sampled signal are classified into a plurality of time windows according to the sampling sequencing, and are compressed and combined to form the intensity information to be used for displaying the waveform trace on the LCD display 108. On the LCD display 108, the lateral axis of the display 108 corresponds to the time axis of the waveform trace, the vertical axis corresponds to the amplitude value of the waveform trace, and each time point on the lateral axis corresponds to one of said time windows. In the intensity information of said waveform trace, a time point may correspond to the intensity information of a plurality of trace points, and the intensity value of each of said trace points is calculated according to the intensity values of one or more sampling points corresponding to the same time window and having the same amplitude value. In the prior art, there are several methods for calculating the intensity value of each trace point on the same time window of the waveform trace, particularly for the present embodiment, a user can select one from a dot display manner and a vector display manner.

In the dot display manner, for each amplitude value in the same time window, the times of the sample points occur are counted statistically, and then the more the sample points occur, the higher the intensity value is, and vice versa. Therefore, the intensity value of all trace points corresponding to the time window can be figured out.

In the vector display manner, not only the intensity value of each trace point in each of said time windows needs to be figured out, but also the intensity value of the respective intermediate point between every two trace points is figured out according to the intensity values of the every two trace points, when the intensity value of the respective intermediate point between every two trace points is calculated, the intensity value can be determined according to the variation speed of the amplitude values between the two sampling points, such as the higher the variation speed, the smaller the intensity value, and vice versa.

According to the different application, the trace intensity calculator 102 can adopt different method for calculating the intensity of the waveform trace to calculate the intensity information of the waveform trace. These methods can be found in the prior art, and are not described in more detail hereinafter for the sake of clarity.

For example, in the different display applications, the trace intensity calculator 102 can adopt different methods for calculating the intensity of the waveform trace. In particular, with respect to the static fluorescence effect, the trace intensity calculator 102 can adopt one of the known methods or the combination of the known methods to calculate the intensity information of the waveform trace. On other hand, with respect to the dynamic fluorescence effect, the trace intensity calculator 102 can adopt another method, such as the method wherein the intensity information of all waveform traces are set to the maximum value of the intensity information, and of course the intensity information of each model trace can be generated in the manner of attenuating the intensity step by step or in another calculation manner.

In the present embodiment, under the control of the central controller 106, the trace intensity synthesizer 103 receives the intensity information of the waveform trace outputted by the trace intensity calculator 102 and generates the accumulated intensity information to be used for driving the displaying means 104.

In particular, the central controller 106 compares the time interval of the trigger signal and a predetermined threshold, controls said trace intensity synthesizer 103 to accumulate the intensity information of a plurality of waveform traces generated by said trace intensity calculator 102 to generate the accumulated intensity information corresponding to the static fluorescence effect when the time interval of the trigger signal is less than or equal to the predetermined threshold, and controls said trace intensity synthesizer 103 to attenuate the old accumulated intensity information and accumulate the intensity information of the waveform trace newly generated by said trace intensity calculator 102 on the basis of the attenuated accumulated intensity information to generate new accumulated intensity information corresponding to the dynamic fluorescence effect when the time interval of the trigger signal is larger than the predetermined threshold.

In the present embodiment, the displaying means 104 includes an intensity mapping apparatus 107 and a LCD display 108. The intensity mapping apparatus 107 receives the accumulated intensity information outputted from the trace intensity synthesizer 103, and maps the accumulated intensity information to the brightness of the LCD display 108. The intensity mapping apparatus 107 can cause different brightness to be represented at a pixel position of the corresponding LCD display when the trace intensity synthesizer 103 outputs different accumulated intensity information at the pixel position. As an example, the intensity mapping apparatus 107 can perform color gradation mapping, gray scale mapping, monochromatic mapping, color mapping or contrast mapping. As another example, in said exemplary embodiment, the screen of the LCD display 108 may have 400*700 pixels.

In order to further describe the digital oscilloscope 100 according to the present exemplary embodiment, the method for controlling the digital oscilloscope 100 will be described below in more detail with reference to FIGS. 1 and 2.

Figure 2:
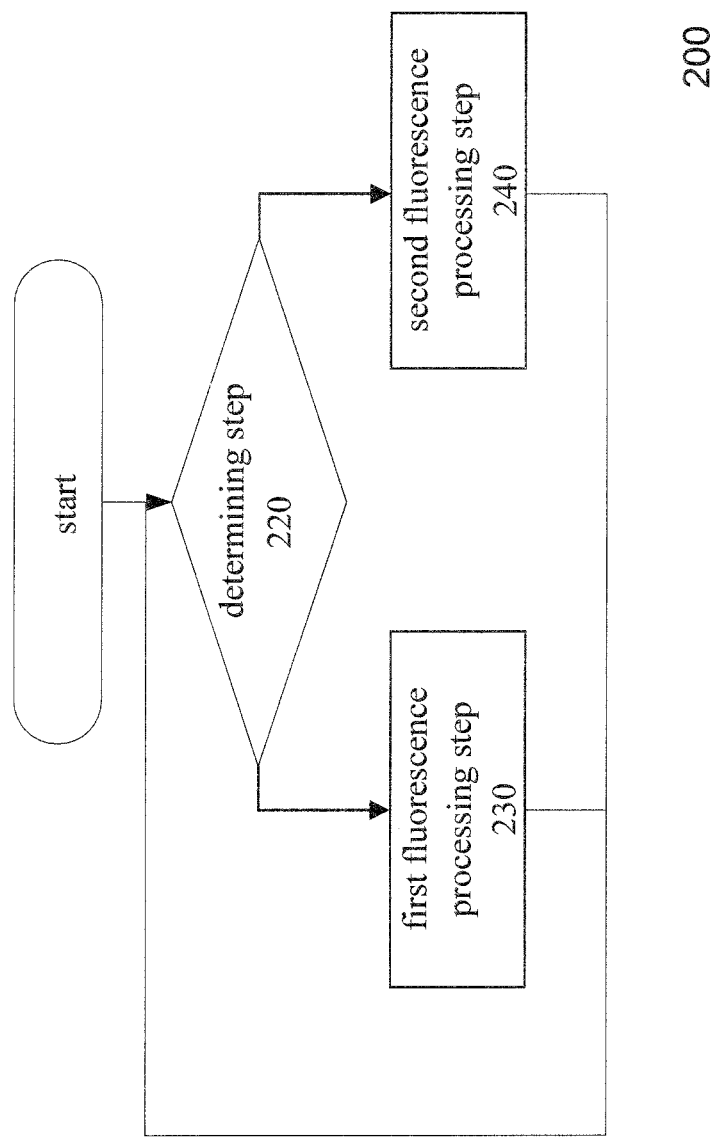
FIG. 2 is a flowchart of the controlling procedure 200 executed by the digital oscilloscope 100 according to the exemplary embodiment of the present invention.

FIG. 2 shows the flowchart of the controlling procedure executed by the digital oscilloscope 100 according to the exemplary embodiment of the present invention.

With reference FIGS. 1 and 2, the central controller 106 determines at step 220 whether the time interval of a trigger signal is larger than a predetermined threshold.

When the time interval of the trigger signal is not larger than the predetermined threshold, that is, when the time interval of the trigger signal is equal to or less than the predetermined threshold, the controlling procedure 200 proceeds to a first fluorescence processing step 230, otherwise the controlling procedure 200 proceeds to a second fluorescence processing step 240.

At step 230, under the control of the central controller 106, the trace intensity synthesizer 103 accumulates the intensity information of a plurality of waveform traces generated by said trace intensity calculator 102 to generate and output the accumulated intensity information corresponding to the static fluorescence effect.

At step 240, under the control of the central controller 106, the trace intensity synthesizer 103 attenuates the old accumulated intensity information and accumulates the intensity information of the waveform trace newly generated by said trace intensity calculator 102 on the basis of the attenuated accumulated intensity information to generate new accumulated intensity information corresponding to the dynamic fluorescence effect.

As an example, at step 230, the trace intensity synthesizer 103 can generate and output the accumulated intensity information corresponding to the static fluorescence effect by performing the following operations: the trace intensity synthesizer 103 outputs the old accumulated resulting intensity information held therein to the displaying means 104. Meanwhile the trace intensity synthesizer 103 receives the intensity information of one or more waveform traces outputted from said trace intensity calculator during outputting the old accumulated resulting intensity information, re-accumulates the intensity information of said one or more waveform traces, and holds the new accumulated result intensity information for being invoked when the first fluorescence process step 230 runs again. When the operation 230 is performed for first time and the trace intensity synthesizer 103 does not hold any accumulated resulting intensity information, the trace intensity synthesizer 103 can output an initial value. For example, said initial value may be 0. The step 230 ends after the trace intensity synthesizer 103 outputs all of said accumulated intensity information to the displaying means 104. At this time, the controlling procedure 200 can return to the determining step 220. Alternatively, the step 230 can be performed repeatedly a predetermined times according to user's setting and then the controlling procedure 200 can return to the determining step 220. Alternatively, the controlling procedure 200 can return to the determining step 220 when the time interval of the trigger signal varies.

In the present example, said predetermined threshold may be predefined on the basis of the screen refresh time interval of the LCD display 108. In order to obtain a better display effect, it should be ensured that the number of the waveform traces displayed on the screen each time is not less than one when the predetermined threshold is set. Thus, the predetermined threshold may be set as less than the screen refresh time interval of the LCD display 108 and larger than 70% of the screen refresh time interval. Still for example, if the screen refresh time interval of the LCD display 108 is about 25 ms, the predetermined threshold may be set as 20 ms. The reasons why the predetermined threshold is set in this way are as follows: if the predetermined threshold is set as larger than the screen refresh time interval, when the static fluorescence display mode is adopted, that is, when the step 230 is performed, the case where the time interval between two trigger signals is larger than the screen refresh time interval will occur, thereby the case where the intensity information of only one waveform trace can be displayed before or after the screen refreshing will occur, such a display effect is undesirable obviously. If the predetermined threshold is set as slightly less than the screen refresh time interval, the above mentioned cases can be avoided, that is, when the time interval between two trigger signals closes to the screen refresh time interval, the digital oscilloscope 100 automatically enters into the dynamic fluorescence display mode, such that the digital oscilloscope 100 may have a perfect display effect no matter how the time interval of the triggers varies. The screen refresh time interval of the LCD display 108 relates to many factors, such as the type, performance, and the driving mode of the display device, the number of the pixels in the display, the size of the display and the like, and also can relate to the display manner thereof. As an example, said predetermined threshold may be set to different values for the LCD display 108 with different sizes and models or adopting different screen refresh manners.

The controlling procedure 200 proceeds to the second fluorescence processing step 240, when it is determined at step 220 that the time interval of the trigger signal is larger than the predetermined threshold. At step 240, under the control of the central controller 106, the trace intensity synthesizer 103 attenuates the old accumulated intensity information and accumulates the intensity information of the waveform trace newly generated by said trace intensity calculator 102 on the basis of the attenuated accumulated intensity information to generate and output new accumulated intensity information corresponding to the dynamic fluorescence effect.

As an example, at step 240, the trace intensity synthesizer 103 can generate and output the accumulated intensity information corresponding to the dynamic fluorescence effect by performing the following operations: at first, the trace intensity synthesizer 103 attenuates the old accumulated intensity information therein, and then accumulates the attenuated accumulated intensity information and the intensity information of a waveform trace newly generated by said trace intensity calculator 102 to form and output new accumulated intensity information to said displaying means 104, wherein the new accumulated intensity information is referred to as first accumulated intensity information for the sake of distinguishing; the trace intensity synthesizer 103 attenuates the first accumulated intensity information again while outputting the first accumulated intensity information to said displaying means 104, and accumulates the attenuated first accumulated intensity information and the intensity information of a waveform trace newly generated by said trace intensity calculator 102 to form another new accumulated intensity information for being invoked when the second fluorescence processing step 240 runs again, wherein the another new accumulated intensity information is referred to as second accumulated intensity information for the sake of distinguishing.

For example, when it is necessary to attenuate said old accumulated intensity information in the trace intensity synthesizer 103 at the time that the second fluorescence processing step 240 runs again, said second accumulated intensity information will be invoked as said old accumulated intensity information.

The step 240 ends after the trace intensity synthesizer 103 outputs all of said accumulated intensity information to the displaying means 104. At this time, the controlling procedure 200 can return to the determining step 220 as shown in FIG. 2. Alternatively, the step 240 can be performed repeatedly a predetermined times according to user's setting and then the controlling procedure 200 can return to the determining step 220. Alternatively, the controlling procedure 200 can return to the determining step 220 when the time interval of the trigger signal varies.

When the operation 240 is performed initially and the trace intensity synthesizer 103 does not hold any accumulated result intensity information, the trace intensity synthesizer 103 can output an initial value. For example, said initial value may be 0.

It should be noted that the steps for generating static fluorescence effect and dynamic fluorescence effect described in the above examples are only for illustrative, and other methods also may be adopted.

In the controlling procedure 200, the digital oscilloscope 100 can achieve the static fluorescence display manner by the first fluorescence processing step 230 and the dynamic fluorescence display manner by the second fluorescence processing step 240, and can automatically select different fluorescence display manners according to the triggering condition of the detected signal. The static fluorescence display manner having higher waveform capture rate may be automatically selected when the triggering rate is relative high, and the dynamic fluorescence display manner having better visual effects and being more fine may be automatically selected when the triggering rate is relative low. This not only brings about a large convenience to the user but also achieves the effect of automatically selecting display manners according to the triggering rate.

In the above embodiment, the trace intensity synthesizer 103 may adopt only one memory for storing and outputting the intensity information when the static or dynamic fluorescence effect is achieved. On the other hand, in order to improve the waveform capture rate, the present application also proposes a structure of a trace intensity synthesizer including two memories. Detail description will be given below with reference to FIG. 3.

Figure 3:
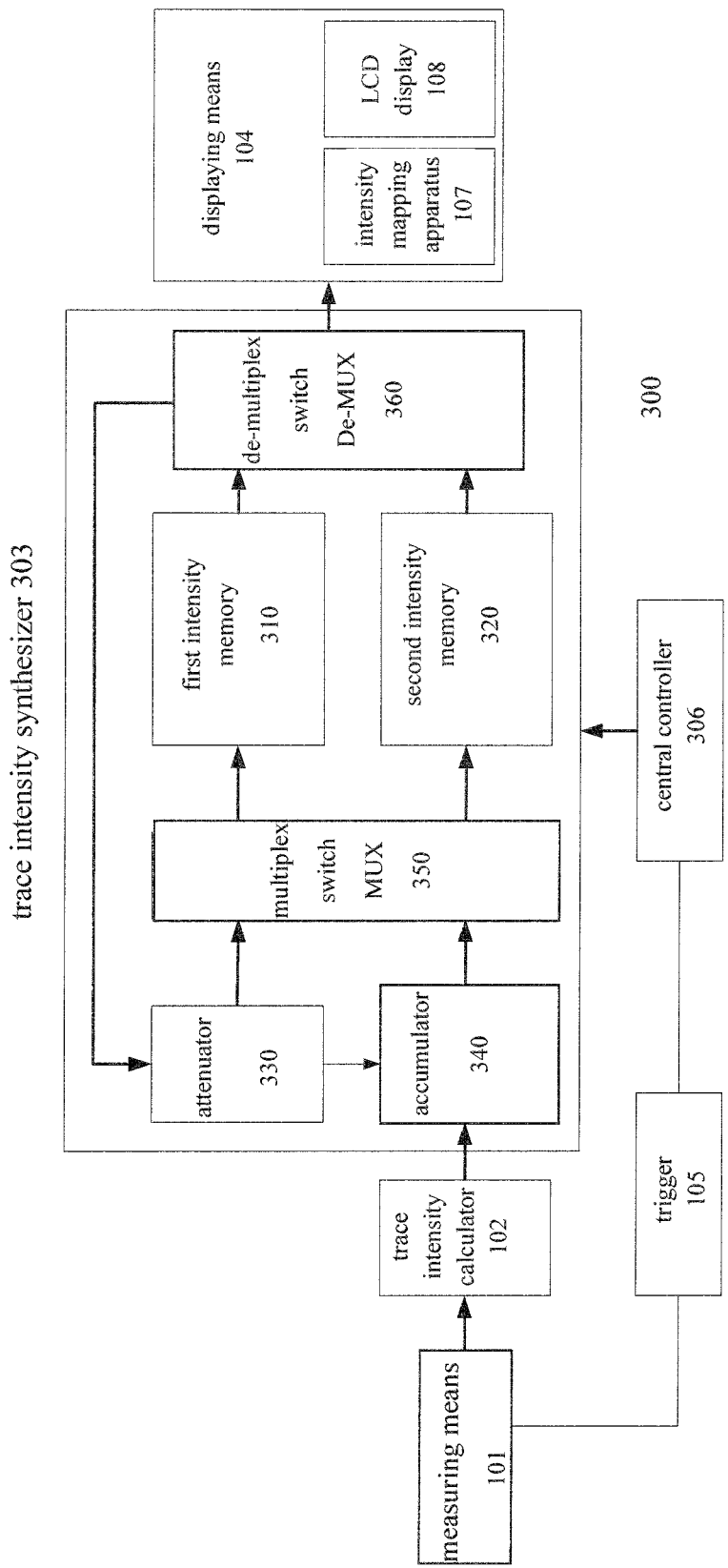
FIG. 3 is a schematic structure diagram of a digital oscilloscope 300 according to another exemplary embodiment of the present invention.

FIG. 3 is a schematic structure diagram of the digital oscilloscope 300 according to another exemplary embodiment of the present invention.

With reference to FIG. 3, in the present exemplary embodiment, the digital oscilloscope 300 includes a measuring means 101, a trace intensity calculator 102, a trace intensity synthesizer 303, a displaying means 104, a trigger 105, and a central controller 306. The measuring means 101, the trace intensity calculator 102, the displaying means 104 and the trigger 105 included in the digital oscilloscope 300 are identical to those included in the digital oscilloscope 100 as shown in FIG. 1 respectively, and are not described repeatedly for the sake of clarity.

In the present exemplary embodiment, the trace intensity synthesizer 303 further includes a first intensity memory 310, a second intensity memory 320, an attenuator 330, an accumulator 340, a multiplex switch MUX 350 and a de-multiplex switch De-MUX 360.

Wherein a first input of the accumulator 340 is connected to an output of the trace intensity calculator 102, an output of the accumulator 340 is connected to a first input of the multiplex switch MUX 350, two output of the multiplex switch MUX 350 are connected to an input of the first intensity memory 310 and an input of the second intensity memory 320 respectively, an output of the first intensity memory 310 and an output of the second intensity memory 320 are connected to the displaying means 104 via the de-multiplex switch 360 respectively, another output of the de-multiplex switch 360 is connected to an input of the attenuator 330, and two output of the attenuator 330 are connected to a second input of the accumulator 340 and a second input of the multiplex switch MUX 350.

In the present exemplary embodiment, the memory units of said first intensity memory 310 and said second intensity memory 320 correspond to pixels of the LCD display 108 in said displaying means 104.

In the present exemplary embodiment, when said time interval of said trigger signal is equal to or less than the predetermined threshold, said central controller 306 controls the digital oscilloscope 300 to operate in the static fluorescence display manner by performing a first operation and a second operation alternatively, such that the LCD display 108 generates the static fluorescence effect.

Said first operation includes: the accumulated intensity information held by said second intensity memory 320 is outputted to said displaying means 104, meanwhile the accumulator 340 receives and accumulates the intensity information of one or more waveform traces outputted from said trace intensity calculator 102 to generate new accumulated intensity information, and said first intensity memory 310 holds the new accumulated intensity information.

Said second operation includes: the accumulated intensity information held by said first intensity memory 310 is outputted to said displaying means 104, meanwhile the accumulator 340 receives and accumulates the intensity information of one or more waveform traces outputted from said trace intensity calculator 102 to generate new accumulated intensity information, and said second intensity memory 320 holds the new accumulated intensity information.

In the present exemplary embodiment, said trace intensity synthesizer 303 may further include the attenuator 330. When said time interval of said trigger signal is larger than the predetermined threshold, said central controller 306 controls the digital oscilloscope 300 to operate in the dynamic fluorescence display manner by performing a third operation and a fourth operation successively, such that the LCD display 108 generates the dynamic fluorescence effect.

Said third operation includes: said attenuator 330 attenuates the old accumulated intensity information held by said first intensity memory 310 once, and said accumulator 340 and said multiplex switch MUX 350 accumulate the attenuated accumulated intensity information and the intensity information of a new waveform trace outputted from said trace intensity calculator 102 to form new accumulated intensity information, and both said first intensity memory 310 and said second intensity memory 320 hold the new accumulated intensity information.

Said fourth operation includes: the accumulated intensity information held by said second intensity memory 320 is outputted to said displaying means 104, meanwhile said attenuator 330 attenuates the accumulated intensity information held by said first intensity memory 310 when a new waveform trace is outputted from the trace intensity calculator 102, and said accumulator 340 and said multiplex switch MUX 350 accumulate the attenuated accumulated intensity information and the intensity information of a waveform trace newly outputted from said trace intensity calculator 102, and said first intensity memory 310 holds the accumulated result.

In order to further describe the digital oscilloscope 300 according to the present exemplary embodiment, the method for controlling the digital oscilloscope 300 will be described below in more detail with reference to FIGS. 3 and 4.

Figure 4:
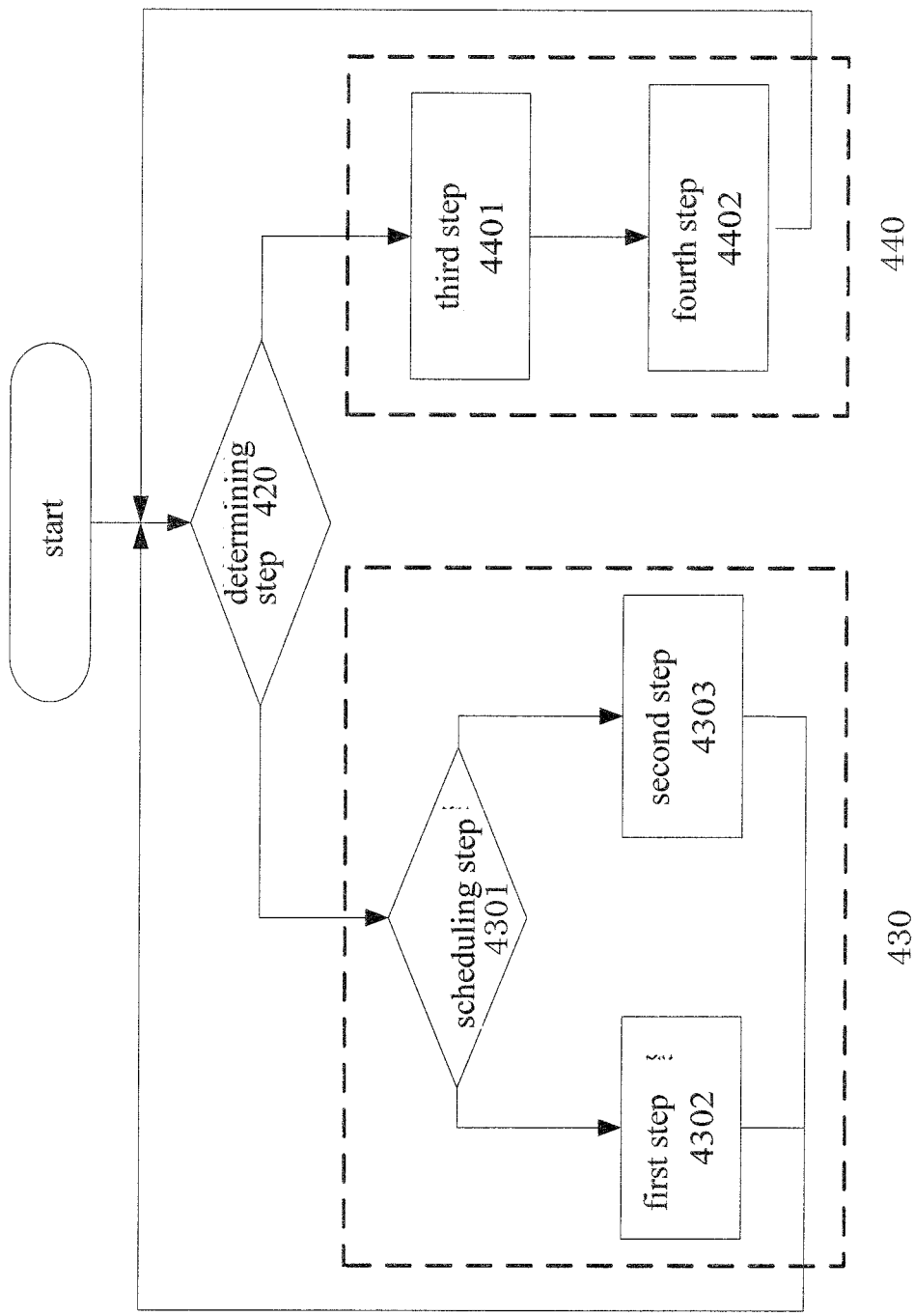
FIG. 4 is a flowchart of the controlling procedure 400 executed by the digital oscilloscope 300 according to the exemplary embodiment of the present invention.

FIG. 4 shows the flowchart of the controlling procedure executed by the digital oscilloscope 300 according to the exemplary embodiment of the present invention.

With reference FIGS. 3 and 4, the central controller 306 determines at step 420 whether the time interval of a trigger signal is larger than a predetermined threshold. When the time interval of the trigger signal is not larger than the predetermined threshold, that is, when the time interval of the trigger signal is equal to or less than the predetermined threshold, the controlling procedure 400 proceeds to a first fluorescence processing step 430. At step 430, under the control of the central controller 306, the trace intensity synthesizer 303 generates and outputs the accumulated intensity information corresponding to the static fluorescence effect.

In the present embodiment, the first fluorescence processing step 430 includes a scheduling step 4301, a first step 4302 and a second step 4303.

the scheduling step 4301:

At the scheduling step 4301, the central controller 306 selects to run one of the first step 4302 and the second step 4303, and runs the first step 4302 and the second step 4303 alternatively. That is, when the time interval of the trigger signal is equal to or less than said predetermined threshold, the waveform sampling rate is fast, and the digital oscilloscope 100 performs the first fluorescence processing step 430, the scheduling step 4301 causes one of the first step 4302 and the second step 4303 run, and the first step and the second step run alternatively, for example, if the first step 4302 runs at the last time, the second step 4303 runs this time.

In the present embodiment, at the first step 4302, the first intensity memory 310 is used as an intensity accumulating mechanism, and the second intensity memory 320 is used as an intensity outputting mechanism. That is to say, at the first step 4302, the second intensity memory 320 outputs the accumulated intensity information about the waveform trace held therein via the de-multiplex switch DE-MUX 360 to the displaying means 104 for displaying the waveform. When the second intensity memory 320 outputs the information held in one memory unit, the memory unit is cleared to zero. Meanwhile if the trace intensity calculator 102 outputs new waveform trace intensity information again, under the control of the central controller 306, said new waveform trace intensity information is inputted to the first input of the accumulator 340, and the accumulated intensity information held by the corresponding memory unit in the first intensity memory 310 is read out synchronously, such that the accumulated intensity information read out from the first intensity memory 310 is outputted to the second input of the accumulator 340 through the de-multiplex switch DE-MUX 360 and the attenuator 330. The accumulator 340 accumulates the accumulated intensity information from the first intensity memory 310 and the intensity information of the waveform trace from the trace intensity calculator 102 upon receiving both of them, and the accumulated result is stored in the corresponding memory unit in the first intensity memory 310. At the first step 4302, the attenuation coefficient of the attenuator 330 is set to 1, that is, the attenuator 330 does not attenuate the signal in this step.

As an example, when the trace intensity calculator 102 outputs to the accumulator 340 the intensity information about the amplitude of the waveform trace at a certain timing (that is, the information about a trace point on a trace), under the control of the central controller 306, the accumulated intensity information held in a memory unit corresponding to the timing and the amplitude in the first intensity memory 310 is read out and outputted to the second input of the accumulator 340 through the de-multiplex switch DE-MUX 360 and the attenuator 330, and then the accumulator 340 accumulates the accumulated intensity information and the intensity information outputted by the trace intensity calculator 102. Finally, the accumulated result outputted by the accumulator 340 is stored again in the same memory unit in the first intensity memory 310 via the multiplex switch MUX 350.

In the present embodiment, when the accumulator 340 accumulates the inputted intensity information, once the accumulated result of the inputted intensity information reaches or exceeds a permitted maximum value of the intensity information, the accumulated result is set to the permitted maximum value of the intensity information. The maximum value of the intensity information herein refers to the intensity information corresponding to the maximum display brightness of the LCD display 108 in the displaying means 104. In the present embodiment, the intensity information corresponding to the maximum display brightness of the display 108 is set to 1, the intensity information corresponding to the minimum display brightness of the display 108 is set to 0, and the intensity information corresponding to any other display brightness of the display 108 is set to numeric values less than 1. Once the accumulated result outputted by the accumulator 340 reaches or exceeds the permitted maximum value "1" of the intensity information, the accumulated result of the accumulator 340 is set to the maximum value "1" of the intensity information under the control of the central controller 306.

In the present embodiment, when the second intensity memory 320 has outputted all of the accumulated intensity information about the waveform traces held therein to the displaying means 104 and the first intensity memory 310 has completed the holding operation for the intensity information of an entire waveform trace, the step 4302 ends.

In the present embodiment, at the second step 4303, the first intensity memory 310 is used as an intensity outputting mechanism, and the second intensity memory 320 is used as an intensity accumulating mechanism. That is to say, at the second step 4303, the first intensity memory 310 outputs the accumulated intensity information about the waveform trace held therein via the de-multiplex switch DE-MUX 360 to the displaying means 104 for displaying the waveform. When the first intensity memory 310 outputs the information held in one memory unit, the memory unit is cleared to zero.

Meanwhile if the trace intensity calculator 102 outputs new waveform trace intensity information again, under the control of the central controller 306, said new waveform trace intensity information is inputted to the first input of the accumulator 340, and the accumulated intensity information held by the corresponding memory unit in the second intensity memory 320 is read out synchronously, such that the accumulated intensity information read out from the second intensity memory 320 is outputted to the second input of the accumulator 340 after passing through the de-multiplex switch DE-MUX 360 and the attenuator 330. The accumulator 340 accumulates the accumulated intensity information from the second intensity memory 320 and the intensity information of the waveform trace from the trace intensity calculator 102 upon receiving both of them, and the accumulated result is stored in the corresponding memory unit in the second intensity memory 320. At the second step 4303, the attenuation coefficient of the attenuator 330 is set to 1, that is, the attenuator 330 does not attenuate the input signal in this step.

Similar to the first step 4302, as an example, when the trace intensity calculator 102 outputs the intensity information about the amplitude of the waveform trace at a certain timing, under the control of the central controller 306, the accumulated intensity information held in a memory unit corresponding to the timing and the amplitude in the second intensity memory 320 is read out and outputted to the second input of the accumulator 340 through the de-multiplex switch DE-MUX 360 and the attenuator 330, and then the accumulator 340 accumulates the accumulated intensity information and the intensity information outputted by the trace intensity calculator 102. Finally, the accumulated result outputted by the accumulator 340 is stored again in the same memory unit in the second intensity memory 320 via the multiplex switch MUX 350.

In the present embodiment, when the accumulator 340 accumulates the inputted intensity information, once the accumulated result of the inputted intensity information reaches or exceeds a permitted maximum value of the intensity information, the accumulated result is set to the permitted maximum value of the intensity information.

In the present embodiment, when the first intensity memory 310 has outputted all of the accumulated intensity information about the waveform traces held therein to the displaying means 104 and the second intensity memory 320 has completed the holding operation for the intensity information of an entire waveform trace, the step 4303 ends.

When the first step 4302 or the second step 4303 ends, the controlling procedure 400 can return to and run the determining step 420 as shown in FIG. 4.

As an example, when the time interval of said trigger signal is continuously less than or equal to the predetermined threshold, that is, the sampling rate is continuously fast, the central controller 306 may return to the determining step 420 after performing the first fluorescence processing step 430 a predetermined times. Alternatively, the controlling procedure 400 may return to the determining step 420 after the first step 4302 or the second step 4303 ends. Such an arrangement enables the digital oscilloscope 300 having a higher speed in the static fluorescence display manner.

In the present example, said predetermined threshold may be predefined on the basis of the screen refresh time interval of the LCD display 108. In order to obtain a better display effect, it should be ensured that the number of the waveform traces displayed on the screen each time is not less than one when the predetermined threshold is set. Thus, the predetermined threshold may be set as less than the screen refresh time interval of the LCD display 108 and larger than 70% of the screen refresh time interval. Still for example, if the screen refresh time interval of the LCD display 108 is about 25 ms, the predetermined threshold may be set as 20 ms. The reasons why the predetermined threshold is set in this way are as follows: if the predetermined threshold is set as larger than the screen refresh time interval, when the static fluorescence display mode is adopted, that is, when the first fluorescence processing step 430 is performed, the case where the time interval between two triggers of the signal is larger than the screen refresh time interval will occur, thereby the case where the intensity information of only one waveform trace can be displayed before or after the screen refresh will occur, such a display effect is undesirable obviously. If the predetermined threshold is set as slightly less than the screen refresh time interval, the above mentioned cases can be avoided, that is, when the time interval between two triggers of signal closes to the screen refresh time interval, the digital oscilloscope 300 automatically enters into the dynamic fluorescence display mode, such that the digital oscilloscope 300 may have a perfect display effect no matter how the time interval of the triggers varies. The screen refresh time interval of the LCD display 108 relates to many factors, such as the type, performance, and driving mode of the display device, the number of the pixels in the display, the size of the display and the like, and also can relate to the display manner thereof. As an example, said predetermined threshold may be set to different values for the LCD display 108 with different sizes and models or adopting different screen refresh manners.

At the first fluorescence processing step 430 of the present exemplary embodiment, said digital oscilloscope 300 uses the first intensity memory 310 and the second intensity memory 320 alternatively to accumulate and output the intensity information, such that the intensity information of the waveform trace will not be lost due to the outputting process of the intensity information. Therefore, as compared to the method and device adopting single intensity memory, the present embodiment obviously increases the waveform capture rate for achieving the static fluorescence display effect.

In the present exemplary embodiment, the central controller 306 controls the digital oscilloscope 300 to perform the second fluorescence processing step 440 when it is determined that the time interval of said trigger signal is larger than the predetermined threshold, that is, the triggering rate is low. At the second fluorescence processing step 440, the trace intensity synthesizer 103 generates and outputs the accumulated intensity information corresponding to the dynamic fluorescence effect under the control of the central controller 306. The second fluorescence processing step 440 can include a third step 4401 and a fourth step 4402 performed successively.

When the third step 4401 is performed, under the control of the central controller 306, the trace intensity calculator 102 outputs new intensity information of a waveform trace to the first input of the multiplex switch MUX 350 via the accumulator 340, meanwhile the trace intensity synthesizer 303 reads out the accumulated intensity information held in the respective memory units in the first intensity memory 310 sequentially and outputs the same to the attenuator 330 via the de-multiplex switch DE-MUX 360, the accumulated intensity information of the waveform trace is attenuated by the attenuator 330, and finally the attenuated accumulated intensity information is outputted to the second input of the multiplex switch MUX 350. Then, under the control of the central controller 306, with respect to a memory unit in the first intensity memory 310, when the trace intensity calculator 102 outputs a new corresponding intensity information of a waveform trace, for example, when the intensity value inputted to the first input of the multiplex switch MUX 350 is not zero, the multiplex switch MUX 350 makes the intensity information inputted to the first input thereof is held in the corresponding memory unit in both the first intensity memory 310 and the second intensity memory 320. On the other hand, with respect to a memory unit in the first intensity memory 310, when the trace intensity calculator 102 does not output the new corresponding intensity information of a waveform trace, for example, when the intensity value inputted to the first input of the multiplex switch MUX 350 is zero, the multiplex switch MUX 350 makes the attenuated accumulated intensity information inputted to the second input thereof is held in the corresponding memory unit in both the first intensity memory 310 and the second intensity memory 320.

The third step 4401 ends after the above holding operation is completed, and then the digital oscilloscope 300 begins to perform the fourth step 4402.

At the fourth step 4402, under the control of the central controller 306, the second intensity memory 320 outputs the accumulated intensity information about the waveform trace held therein to the displaying means 104 for being used to display the waveform via the de-multiplex switch MUX 350.

It should be noted that a long time is usually spent on outputting all of the accumulated intensity information held by the second intensity memory 320 to the displaying means 104. In the present embodiment, during the long time, the central controller 306 controls the second intensity memory 320 to output the accumulated intensity information held therein to the displaying means 104 and meanwhile checks whether the trace intensity calculator 102 outputs new intensity information of a waveform trace. When the trace intensity calculator 102 outputs again new intensity information of a waveform trace to the first input of the multiplex switch MUX 350 via the accumulator 340, the following operations are performed under the control of the central controller 360: the central controller 360 controls to read out the accumulated intensity information held in the respective memory units in the first intensity memory 310 and output the same to the attenuator 330 via the de-multiplex switch DE-MUX 360, the accumulated intensity information of the waveform trace is attenuated by the attenuator 330, and finally the attenuated accumulated intensity information is outputted to the second input of the multiplex switch MUX 350. Then, under the control of the central controller 306, with respect to a memory unit in the first intensity memory 310, when the trace intensity calculator 102 outputs the new corresponding intensity information of a waveform trace, for example, when the intensity value inputted to the first input of the multiplex switch MUX 350 is not zero, the multiplex switch MUX 350 makes the intensity information inputted to the first input thereof is held in the corresponding memory unit in the first intensity memory 310. On the other hand, with respect to a memory unit in the first intensity memory 310, when the trace intensity calculator 102 does not output a new corresponding intensity information of a waveform trace, for example, when the intensity value inputted to the first input of the multiplex switch MUX 350 is zero, the multiplex switch MUX 350 makes the attenuated accumulated intensity information inputted to the second input thereof is held in the corresponding memory unit in the first intensity memory 310.

After the accumulated intensity information in the respective memory units of the first intensity memory 310 is subjected to the above data processing, that is, after the holding operation of the accumulated intensity information of an entire waveform trace is completed, if the central controller 360 still performs the operation of outputting the accumulated intensity information held in the second intensity memory 320 to the displaying means 104, it continues to check whether the trace intensity calculator 102 outputs new waveform trace intensity information, and performs the above operations again when the trace intensity calculator 102 again outputs new intensity information of waveform trace to the first input of the multiplex switch MUX 350 via the accumulator 340.

When the second intensity memory 320 has outputted all of the accumulated intensity information held therein to the displaying means 104 and the first intensity memory 310 has completed the holding operation for the intensity information of an entire waveform trace, the step 4302 ends, and the controlling procedure 400 will return to the determining step 420.

As an example, in the present embodiment, the attenuating rate of the attenuator 330 can be set by the user. Still as an example, the attenuating rate will affect the duration of the dynamic fluorescence display effect, i.e. the duration of the afterglow represented by the waveform trace on the display 108. For example, a small attenuating rate may correspond to the long-time dynamic fluorescence display effect, that is to say, the waveform trace on the display 108 will represent a long-time afterglow, on the other hand, a large attenuating rate may correspond to the short-time dynamic fluorescence display effect, that is to say, the afterglow represented by the waveform trace on the display 108 has a short duration. As another example, the attenuating rate of said attenuator 330 may be automatically set by the central controller 306 according to the time interval of the trigger signal, for example, the central controller 306 automatically decreases said attenuating rate when the time interval of the trigger signal increases, and increases said attenuating rate when the time interval of the trigger signal decreases.

The controlling procedure 400 can return to the determining step 420 as shown in FIG. 4 after the fourth step 4402 ends. Alternatively, the controlling procedure 400 may return to the determining step 420 after the step 440 is performed repeatedly for a predetermined times. Such an arrangement enables the digital oscilloscope 300 having a higher speed in the dynamic fluorescence display manner.

In the present embodiment, when the time interval of said trigger signal is larger than a predetermined threshold and the digital oscilloscope 300 runs the second fluorescence processing step 440, the digital oscilloscope 300 also makes said trace intensity calculator 102 set the numeric value of the outputted intensity information of all trace points on the waveform trace to the maximum value of the intensity information. However, it is only for illustrative, and the numeric value can be set to different values for different applications. For example, when the third step 4401 runs, the trace intensity calculator 102 only sets the intensity information of all trace points on the first new waveform trace outputted thereafter to said maximum value, and sets the intensity information of all trace points on the other waveform traces outputted later to a value resulted from said maximum value multiplying a fixed attenuating coefficient or an attenuating coefficient varying according to a certain rule. The numeric value of the intensity information of the waveform traces outputted later by the trace intensity calculator 102 may be associated with the trigger signal, for example, the numeric value of the intensity information is in inverse proportion to the length from the timing when the trigger signal appears to the timing when the intensity information of the waveform trace is outputted to the screen, that is to say, the longer the length from the timing when the trigger signal appears to the screen refresh timing, the smaller the numeric value of the intensity information of the waveform trace, and the like. In this way, when the LCD display 108 displays each waveform trace, the variation of the brightness of the trace points in each waveform trace can reflect the sequencing of the trace points.

In the present embodiment, when the time interval of said trigger signal is continuously larger than a predetermined threshold, that is to say, when the sampling rate is continuously slow, the second fluorescence processing step 440 will perform the third step 4401 and the fourth step 4402 successively for a plurality of times to make the two memories 310 and 320 hold and output the intensity information respectively. In this way, the digital oscilloscope 300 not only can reflect the sequencing of the occurrence of the waveform traces and represent the dynamic fluorescence display effect having a variable intensity by the brightness of the respective waveform traces, but also has more processing time to capture the waveform so as to achieve a higher waveform capture rate.

The second fluorescence processing step 440 for representing the dynamic fluorescence effect illustrated in the present embodiment is only for illustrative, and other methods may be used to achieve the dynamic fluorescence effect. For example, in the case where the trigger signal is especially slow, said third step 4401 may hold the accumulated intensity information in the first intensity memory 310 directly to the corresponding memory unit in said second intensity memory 320 without accumulating thereon the intensity information about the waveform trace newly outputted by the trace intensity calculator 102. Such a method is suitable to the case where the trigger signal is especially slow.

In the present embodiment, the digital oscilloscope 300 may automatically set the degree of said attenuation to the old trace intensity information in the dynamic fluorescence display mode according to the time interval of the trigger signal. Particularly, it is necessary for the LCD display 108 of the displaying means 104 of the digital oscilloscope 300 to make the afterglow effect of the waveform represented thereon adapt to the triggering condition of the detected signal automatically. The afterglow maintains a long time when the time interval of the triggers is long, and the afterglow maintains a short time when the time interval of the triggers is short. Such an automatic processing manner not only reduces the complexity of the operation and setting of the digital oscilloscope 300 having the fluorescence display function, but also is useful for the digital oscilloscope 300 to capture anomalous waveforms, especially those unknown burst anomalous waveforms, In addition, in the present embodiment, the trace intensity synthesizer 303 consists of two memories 310 and 320, in the static fluorescence display manner, the digital oscilloscope 300 can have more time to capture the waveform by making the two memories 310 and 320 hold and output the intensity information alternatively, so as to achieve a higher waveform capture rate. On the other hand, in the dynamic fluorescence display manner, the present embodiment also uses these two memories 310 and 320 to form the dynamic fluorescence effect by making one of the two memories responsible for holding the accumulated intensity information and the other mainly responsible for outputting the accumulated intensity information, wherein the dynamic fluorescence display manner not only has a better afterglow display effect, but also has a higher waveform capture rate thanks to the parallel holding method.

The digital oscilloscope 300 and the controlling procedure 400 thereof according to the exemplary embodiment of the present invention, not only the static fluorescence display manner or the dynamic fluorescence display manner may be selected according to the triggering condition of the detected signal, but also the display effect of the digital oscilloscope 300 is more closer to the CRT display effect of the analog oscilloscope, which provides a more intuitive waveform display and supplies more rich and more efficient information.

What is claimed is:

1. A method for controlling a digital oscilloscope comprising a trace intensity calculator for generating intensity information of a waveform trace, a trace intensity synthesizer for generating accumulated intensity information according to the intensity information of the waveform trace generated by said trace intensity calculator, and a displaying means for displaying a waveform according to said accumulated intensity information; and said method including the steps of:
   a determining step for determining, by a controller, whether a time interval between trigger signals is larger than a predetermined threshold, turning to a static fluorescence processing step when said time interval between the trigger signals is equal to or less than the predetermined threshold, and otherwise turning to a dynamic fluorescence processing step;
   the static fluorescence processing step for accumulating the intensity information of a plurality of waveform traces generated by said trace intensity calculator to generate the accumulated intensity information corresponding to a static fluorescence effect; and
   the dynamic fluorescence processing step for attenuating old accumulated intensity information and accumulating the intensity information of the waveform trace newly generated by said trace intensity calculator on the basis of the attenuated accumulated intensity information to generate new accumulated intensity information corresponding to a dynamic fluorescence effect.

2. The method according to claim 1, wherein said static fluorescence processing step further includes: while the accumulated intensity information being outputted to said displaying means, accumulating the intensity information of the plurality of waveform traces outputted from said trace intensity calculator to generate new accumulated intensity information.

3. The method according to claim 2, wherein said dynamic fluorescence processing step further includes: attenuating the old accumulated intensity information and then accumulating the attenuated accumulated intensity information and the intensity information of a waveform trace newly generated by said trace intensity calculator to generate and output new accumulated intensity information to said displaying means; while the new accumulated intensity information being outputted to said displaying means, further attenuating the new accumulated intensity information and accumulating the attenuated information and the intensity information of the waveform trace newly generated by said trace intensity calculator to form new accumulated intensity information.

4. The method according to claim 3, wherein said dynamic fluorescence processing step further includes setting the degree of said attenuation according to the length of the time interval between the trigger signals.

5. The method according to claim 4, wherein said dynamic fluorescence processing step further includes making said trace intensity calculator set the outputted intensity information of all trace points on the waveform trace to the maximum value of the intensity information.

6. The method according to claim 1, wherein said predetermined threshold is set as less than the screen refresh time interval of said displaying means and larger than 70% of the screen refresh time interval.

7. A digital oscilloscope, comprising:
a trace intensity calculator for generating intensity information of a waveform trace;
a trace intensity synthesizer for generating accumulated intensity information according to the intensity information of a plurality of waveform traces generated by said trace intensity calculator;
a displaying means for displaying a waveform according to said accumulated intensity information; and
a controller for determining whether a time interval between trigger signals is larger than a predetermined threshold,
making said trace intensity synthesizer accumulate the intensity information of a plurality of waveform traces generated by said trace intensity calculator to generate the accumulated intensity information corresponding to a static fluorescence effect when said time interval between the trigger signals is equal to or less than the predetermined threshold, and
making said trace intensity synthesizer attenuate old accumulated intensity information and accumulate the intensity information of the waveform trace newly generated by said trace intensity calculator on the basis of the attenuated accumulated intensity information to generate new accumulated intensity information corresponding to a dynamic fluorescence effect when said time interval between the trigger signals is larger than the predetermined threshold.

8. The digital oscilloscope according to claim 7, wherein said trace intensity synthesizer further includes: an accumulating apparatus, a first memory, and a second memory, wherein when said time interval between the trigger signals is equal to or less than the predetermined threshold, said controller controls to perform a first operation and a second operation alternatively;
said first operation includes: the accumulated intensity information held by said second memory is outputted to said displaying means, meanwhile the accumulating apparatus receives and accumulates the intensity information of a plurality of waveform traces outputted from said trace intensity calculator to generate new accumulated intensity information, and said first memory holds the new accumulated intensity information; and
said second operation includes: the accumulated intensity information held by said first memory is outputted to said displaying means, meanwhile the accumulating apparatus receives and accumulates the intensity information of a plurality of waveform traces outputted from said trace intensity calculator to generate new accumulated intensity information, and said second memory holds the new accumulated intensity information.

9. The digital oscilloscope according to claim 8, wherein said trace intensity synthesizer further includes an attenuator, and said controller controls to perform a third operation and a fourth operation successively when said time interval between the trigger signals is larger than the predetermined threshold,
said third operation includes: said attenuator attenuates the old accumulated intensity information held by said first memory once, and said accumulating apparatus accumulates the attenuated accumulated intensity information and the intensity information of a waveform trace newly outputted from said trace intensity calculator to generate new accumulated intensity information, and both said first memory and said second memory hold the new accumulated intensity information; and
said fourth operation includes: the accumulated intensity information held by said second memory is outputted to said displaying means, meanwhile said attenuator attenuates the accumulated intensity information held by said first memory, and said accumulating apparatus accumulates the attenuated accumulated intensity information and the intensity information of a waveform trace newly outputted from said trace intensity calculator, and said first memory holds the accumulated result.

10. The digital oscilloscope according to claim 9, wherein said controller further sets the degree of said attenuation according to the length of the time interval between the trigger signals.

11. The digital oscilloscope according to claim 10, wherein said controller further makes said trace intensity calculator set the outputted intensity information of all trace points on the waveform trace to the maximum value of the intensity information when the time interval between the trigger signals is larger than the predetermined threshold.

12. The digital oscilloscope according to claim 7, wherein said predetermined threshold is set as less than the screen refresh time interval of said displaying means and larger than 70% of the screen refresh time interval.

* * * * *